United States Patent
Williams

(10) Patent No.: US 11,522,306 B2
(45) Date of Patent: Dec. 6, 2022

(54) TRANSFORMATION CONNECTOR

(71) Applicant: GITech Inc., Austin, TX (US)

(72) Inventor: John Williams, Austin, TX (US)

(73) Assignee: GITech Inc., Austin, TX (US)

( * ) Notice: Subject to any disclaimer, the term of this patent is extended or adjusted under 35 U.S.C. 154(b) by 113 days.

(21) Appl. No.: 17/179,405

(22) Filed: Feb. 19, 2021

(65) Prior Publication Data

US 2021/0175648 A1 Jun. 10, 2021

Related U.S. Application Data

(63) Continuation of application No. 16/513,188, filed on Jul. 16, 2019, now Pat. No. 10,985,480, which is a
(Continued)

(30) Foreign Application Priority Data

| Apr. 30, 2018 | (TW) | ................................. 107114634 |
| May 17, 2018 | (CN) | ......................... 201810474999.1 |
| Jun. 25, 2018 | (TW) | ................................. 107121644 |

(51) Int. Cl.
| *H01R 12/70* | (2011.01) |
| *H01R 12/82* | (2011.01) |
| *H01R 31/00* | (2006.01) |

(52) U.S. Cl.
CPC ......... *H01R 12/7076* (2013.01); *H01R 12/82* (2013.01); *H01R 31/005* (2013.01)

(58) Field of Classification Search
CPC ............ H01R 12/7076; H01R 12/7082; H01R 12/82; H01R 31/005; H05K 7/1061
See application file for complete search history.

(56) References Cited

U.S. PATENT DOCUMENTS

| 4,806,104 A | 2/1989 | Cabourne |
| 4,871,316 A | 10/1989 | Herrell |
| | (Continued) | |

FOREIGN PATENT DOCUMENTS

| CN | 2927364 Y | 7/2007 |
| CN | 201438572 U | 4/2010 |
| | (Continued) | |

OTHER PUBLICATIONS

Office Action and Search Report for China Application No. 201810474999.1, dated May 28, 2020, 8 pages.
(Continued)

*Primary Examiner* — Jean F Duverne

(57) ABSTRACT

An electrical connector including a substrate, a pitch transformation routing assembly formed on the substrate and including pitch transformation routing members, a first set of contact members, each contact member extends away from a first end of a corresponding pitch transformation routing member, and a second set of contact members, each contact member extends away from a second end of a corresponding pitch transformation routing member. A first subset of the pitch transformation routing members each includes a first routing section extending in a first direction and a second routing section extending in a second direction. A pitch of the first set of contact members associated with the first subset of the pitch transformation routing members is different from a pitch of the second set of contact members associated with the first subset of the pitch transformation routing members.

24 Claims, 22 Drawing Sheets

Related U.S. Application Data continuation-in-part of application No. 16/246,529, filed on Jan. 13, 2019, now Pat. No. 11,047,878, which is a continuation-in-part of application No. 16/394,247, filed on Apr. 25, 2019, now Pat. No. 11,067,603.

(56) References Cited

U.S. PATENT DOCUMENTS

| | | | |
|---|---|---|---|
| 5,628,635 | A | 5/1997 | Ikeya |
| 6,400,169 | B1 | 6/2002 | Hembree |
| 6,559,665 | B1 | 5/2003 | Barabi |
| 7,435,100 | B2 | 10/2008 | Chang |
| 7,722,361 | B2 | 5/2010 | Lopez et al. |
| 7,956,631 | B2 | 6/2011 | Chen et al. |
| 7,989,945 | B2 | 8/2011 | Williams et al. |
| 10,398,051 | B2 | 8/2019 | Kawabata |
| 10,461,461 | B2 | 10/2019 | Shimtosu |
| 2004/0252477 | A1 | 12/2004 | Brown et al. |
| 2007/0275572 | A1 | 11/2007 | Willliams et al. |
| 2008/0061808 | A1* | 3/2008 | Mok .............. G01R 1/07357 427/98.6 |
| 2016/0118210 | A1 | 4/2016 | Beroz |
| 2017/0094791 | A1* | 3/2017 | Enriquez Shibayama .............. H05K 3/368 |
| 2018/0358733 | A1 | 12/2018 | Shimtosu |
| 2018/0376610 | A1 | 12/2018 | Kawabata |
| 2019/0391180 | A1 | 12/2019 | Williams |
| 2020/0227844 | A1 | 7/2020 | Willliams |

FOREIGN PATENT DOCUMENTS

| | | |
|---|---|---|
| CN | 203871520 U | 10/2014 |
| TW | M377746 U | 4/2010 |
| TW | I331423 B | 10/2010 |
| TW | 201112505 A | 4/2011 |
| TW | I556084 B | 11/2016 |
| TW | I668451 B | 8/2019 |

OTHER PUBLICATIONS

Office Action and Search Report for Taiwan Application No. 10920467420, dated May 21, 2020, 5 pages.

Office Action for Korean Application No. 20190069459, dated Apr. 13, 2020, 4 pages.

* cited by examiner

TRANSFORMATION CONNECTOR

CROSS-REFERENCE TO RELATED APPLICATIONS

This application is a continuation of co-pending U.S. patent application Ser. No. 16/513,188, entitled TRANSFORMATION CONNECTOR, filed Jul. 16, 2019, which is a continuation-in-part application of U.S. patent application Ser. No. 16/246,529 filed on Jan. 13, 2019, which claims the benefit of Patent Application No. TW107114634 filed in Taiwan, Republic of China on Apr. 30, 2018, and claims the benefit of Patent Application No. CN201810474999.1 filed in People's Republic of China on May 17, 2018. This application is a continuation-in-part application of U.S. patent application Ser. No. 16/394,247 filed on Apr. 25, 2019, which claims the benefit of Patent Application No. TW107121644 in Taiwan, Republic of China filed on Jun. 25, 2018. The disclosure made in the patent application Ser. No. 16/246,529, and the disclosure made in the patent application Ser. No. 16/394,247 are hereby incorporated by reference.

FIELD OF THE INVENTION

This invention relates generally to an electrical connector. More particularly, the present invention relates to an electrical connector having contact members and routing members.

BACKGROUND OF THE INVENTION

FIG. 1 shows an example of an existing transformation platform 100. The existing transformation platform 100 comprises a bottom stiffener 110, a printed circuit board (PCB) 120, a PCB interposer substrate 130, an alignment frame 140 containing an LGA socket, a central processing unit (CPU) 150, and a cooling system 160. The transformation occurs inside the PCB interposer substrate 130. In this example, the mating pads of the PCB 120 are too small for a land grid array (LGA) connector to properly connect to. It is advantageous to develop a new adaptation interposer with larger top side pads together with solder balls attached to a bottom side of the PCB interposer substrate 130 so that it may be solder down to the PCB 120. The larger top side pads ensure that the LGA socket of the alignment frame 140 can connect to the larger top side pads without wiping off the top side pads when the LGA socket and the alignment frame 140 are under operational conditions.

FIG. 2A shows a conventional PCB interposer substrate 290. A diameter of pads 292 on a top side of the PCB interposer substrate 290 is larger than a diameter of pads 294 on a bottom side of the PCB interposer substrate 290. Each one of the pads 292 is mechanically and electrically connected to a respective pad of the pads 294 by a respective via 296. FIG. 2B shows a conventional PCB interposer substrate 291 containing solder balls 299 attached to pads 295. A diameter of pads 293 on a top side of the PCB interposer substrate 291 is larger than a diameter of pads 295 on a bottom side of the PCB interposer substrate 291. Each pad of the pads 293 is mechanically and electrically connected to a respective pad of the pads 295 by a respective via 297.

One advantage of the electrical connector of the present disclosure is its scalable nature. The electrical connector can connect a first board to a second board having different pitches of contact pads. The electrical connector may be employed to test various electronic devices.

SUMMARY OF THE INVENTION

In some embodiments, an electrical connector includes a substrate, a pitch transformation routing assembly formed on the substrate and including pitch transformation routing members, a first set of contact members, each contact member extends away from a first end of a corresponding pitch transformation routing member, and a second set of contact members, each contact member extends away from a second end of a corresponding pitch transformation routing member. A first subset of the pitch transformation routing members each includes a first routing section extending in a first direction and a second routing section extending in a second direction. A pitch of the first set of contact members associated with the first subset of the pitch transformation routing members is different from a pitch of the second set of contact members associated with the first subset of the pitch transformation routing members.

In other embodiments, an electrical connector includes a substrate extending along a first direction, a routing assembly formed on the substrate and comprising a set of routing members, each routing member having a first end and a second end, the second end opposite the first end in a second direction, the second direction being perpendicular to the first direction; and a set of contact members. Each contact member connects to a respective routing member at the first end of the routing member and includes a slender portion and an end portion extending away from the first end of the routing member. The second ends of the plurality of routing members have a shape adapted to be coupled to respective sockets of a board to be coupled thereto

DETAILED DESCRIPTION OF THE INVENTION

Figure 1:
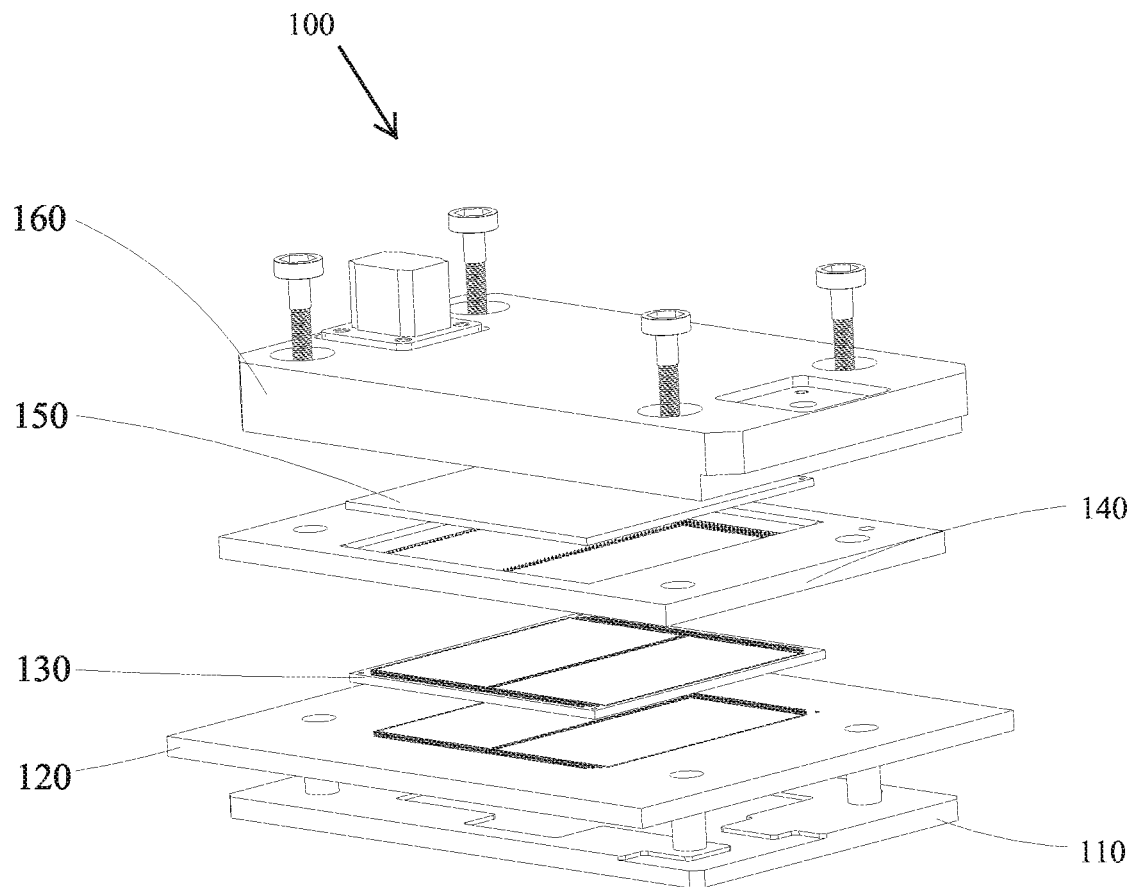
FIG. 1 is a perspective view of a conventional testing apparatus.
Figure 2A:
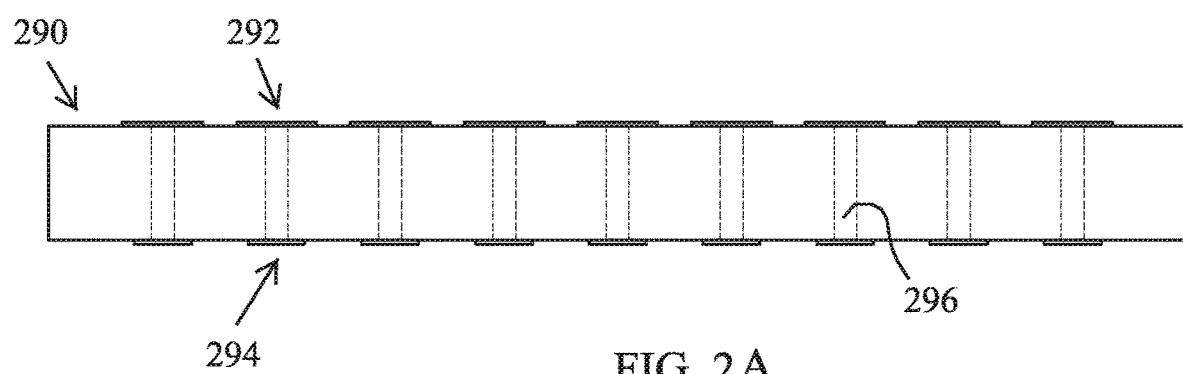
FIG. 2A is a cross sectional view of a conventional PCB interposer substrate.
Figure 2B:
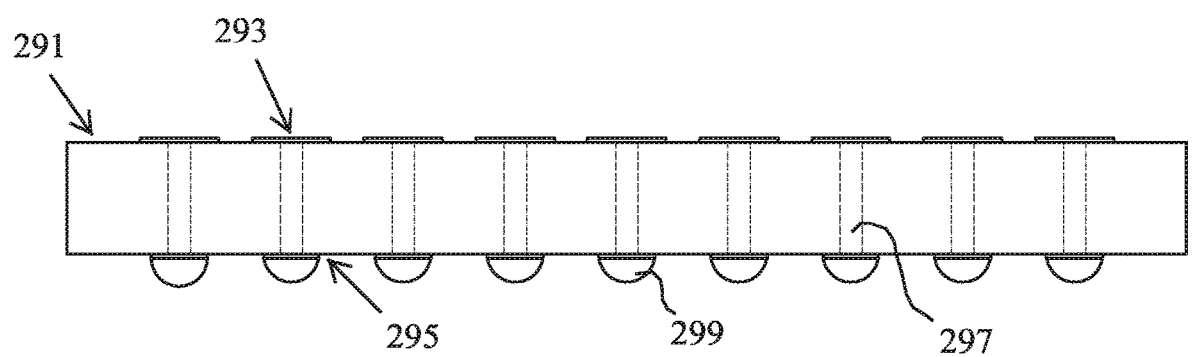
FIG. 2B is a cross sectional view of a conventional PCB interposer substrate comprising solder balls attached to a bottom side of the conventional PCB interposer substrate.
Figure 3:
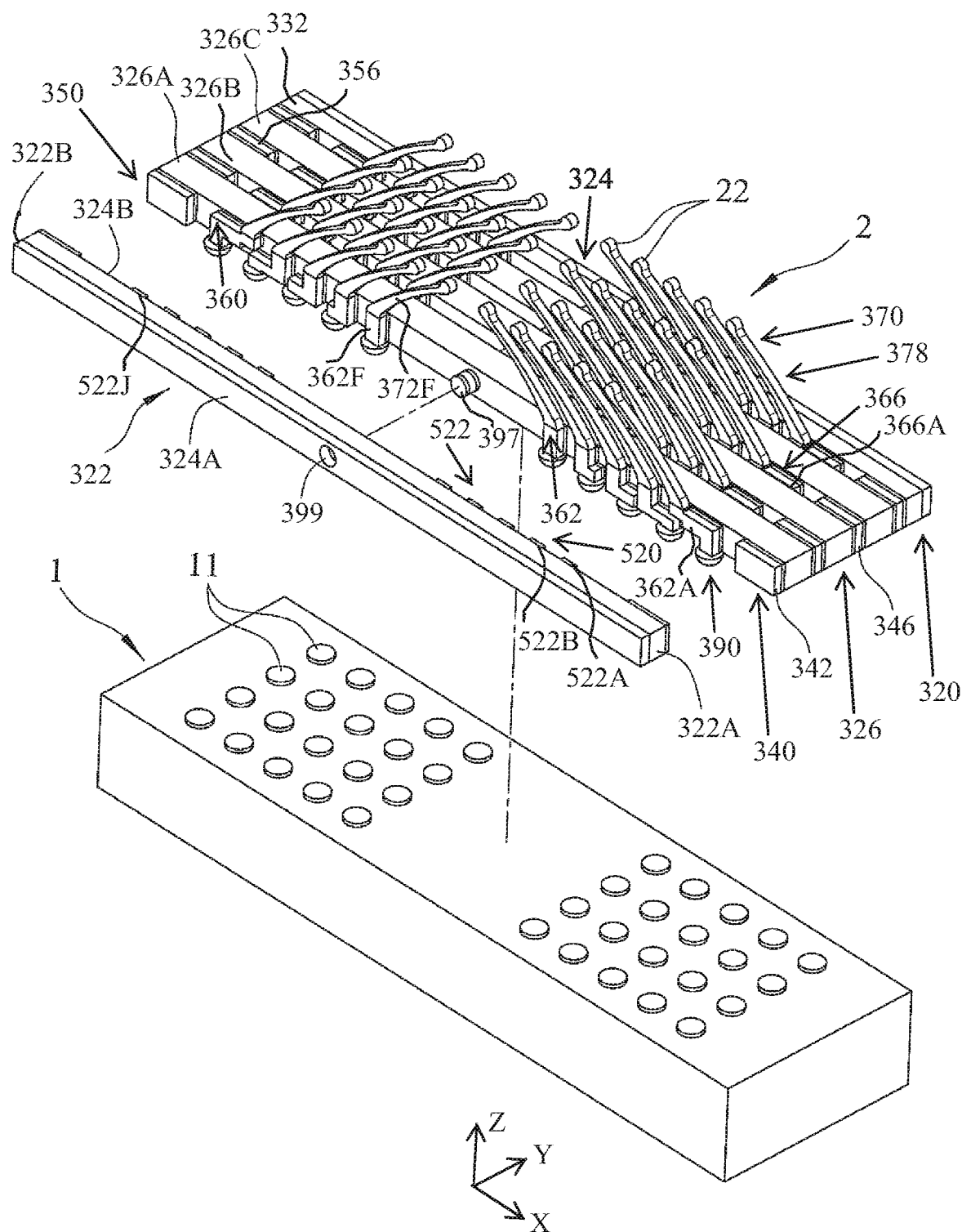
FIG. 3 is a perspective view of a partially exploded plot of a connector and a driving module in examples of the present disclosure.
Figure 5:
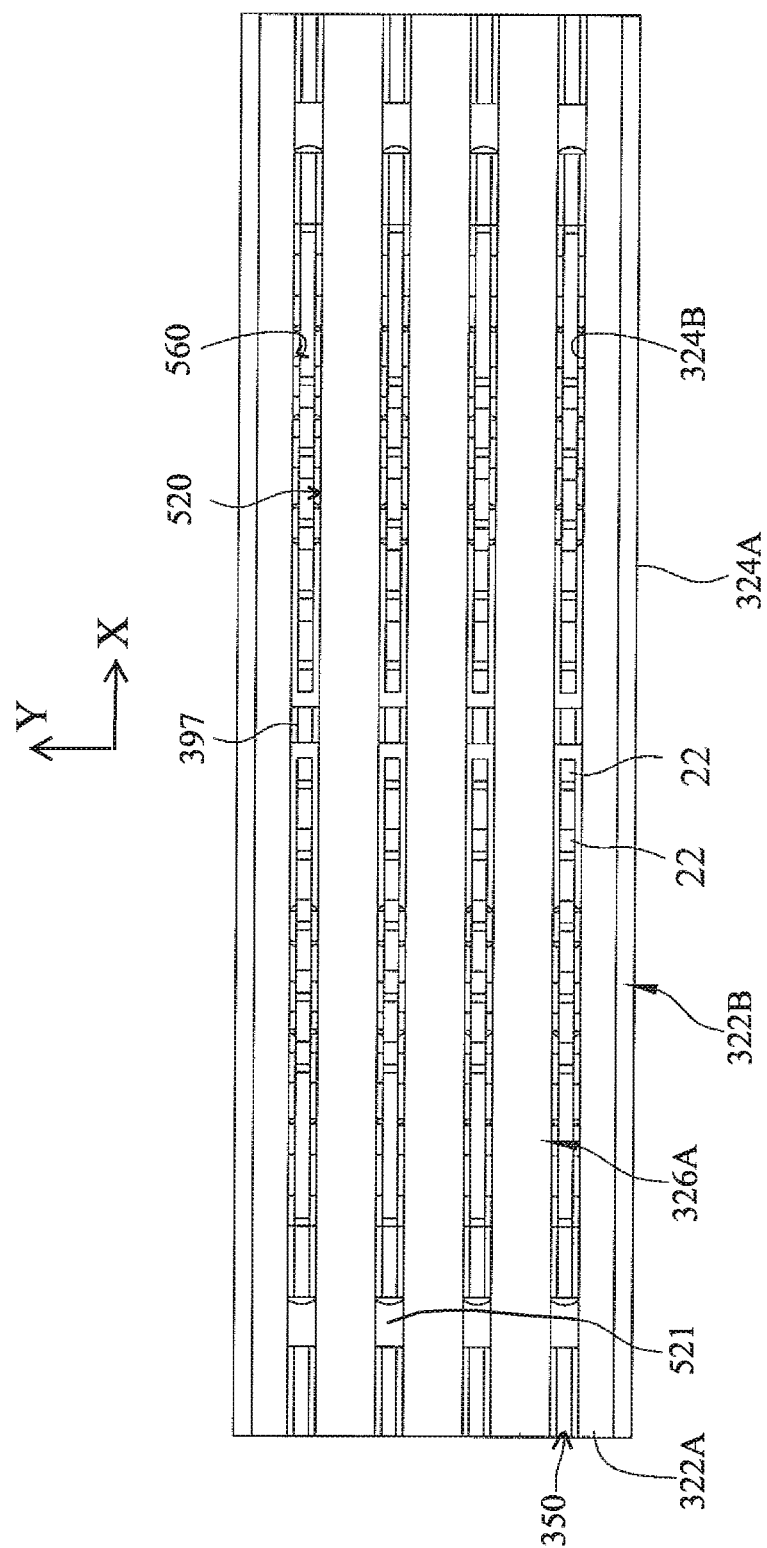
FIG. 5 is a top view of a connector in examples of the present disclosure.

FIG. 3 is a perspective view of a partially exploded plot of a connector 2 and a driving module 1 in examples of the present disclosure. FIG. 5 is a top view of the connector 2 of FIG. 3. The driving module 1 comprises a plurality of pads 11. The connector 2 comprises a plurality of hemisphere metal units 390. In examples of the present disclosure, a total number of the plurality of pads 11 equals to a total number of the plurality of hemisphere metal units 390. A total number of rows (parallel to X-direction) of the plurality of pads 11 equals to a total number of rows of the plurality of hemisphere metal units 390. A total number of columns (parallel to Y-direction) of the plurality of pads 11 equals to a total number of columns of the plurality of hemisphere metal units 390.

In examples of the present disclosure, the connector 2 is an electrical connector. The connector 2 comprises a plurality of substrates 320, a first plurality of spacers 340, a second plurality of spacers 350, a plurality of pitch transformation routing assemblies 360, and a plurality of contact assemblies 370.

In examples of the present disclosure, the plurality of substrates 320 each extends along X-direction. Each of the plurality of substrates 320 is of a rectangular prism shape. The plurality of substrates 320 comprises a front substrate 322, a back substrate 332, and a plurality of intermediate substrates 326 disposed between the front substrate 322 and the back substrate 332. Though only three intermediate substrates 326A, 326B, and 326C are shown in FIG. 3, a total number of the intermediate substrates may vary. In one example, there is only one intermediate substrate. In another example, there are two intermediate substrates. In still another example, there are twelve intermediate substrates.

In examples of the present disclosure, the front substrate 322 comprises a non-conductive layer 322A (except having a conductive front surface 324A), an insulation layer 322B, and a first plurality of standoff assemblies 520. A front surface 324A of the front substrate 322 does not directly contact one of the first plurality of spacers 340. A back surface 324B of the front substrate 322 directly contacts (partially exploded plot of FIG. 3) spacer 342 of the first plurality of spacers 340. In examples of the present disclosure, front surface 324A (for example, a conductive coating), the first plurality of standoff assemblies 520, the spacer 346, the spacer 356, and the pitch transformation routing assembly 366 are made of conduct materials.

In examples of the present disclosure, the back substrate 332 comprises a non-conductive layer (except having a conductive back surface), an insulation layer, and a plurality of standoff assemblies. A back surface of the back substrate 332 does not directly contact one of the first plurality of spacers 340. A front surface of the back substrate 332 directly contacts one of the first plurality of spacers 340.

In examples of the present disclosure, a front surface of each of the plurality of intermediate substrates 326 directly contacts one of the first plurality of spacers 340. A back surface of each of the plurality of intermediate substrates 326 directly contacts one of the first plurality of spacers 340.

In examples of the present disclosure, each of the second plurality of spacers 350 and a respective spacer of the first plurality of spacers 340 connect a respective substrate of the plurality of substrates 320 to a respective adjacent substrate of the plurality of substrates 320. For example, spacer 356 of the second plurality of spacers 350 and spacer 346 of the first plurality of spacers 340 connect substrates 326B to substrate 326C.

In examples of the present disclosure, each of the plurality of pitch transformation routing assemblies 360 is surrounded by a corresponding substrate of the plurality of substrates 320, a corresponding spacer of the first plurality of spacers 340, a corresponding adjacent substrate of the plurality of substrates 320, and a corresponding spacer of the second plurality of spacers 350. For example, a pitch transformation routing assembly 366 of the plurality of pitch transformation routing assemblies 360 is surrounded by the substrate 326B, the spacer 346 of the first plurality of spacers 340, a substrate 326C (adjacent to the substrate 326B), and the spacer 356 of the second plurality of spacers 350. For example, the pitch transformation routing assembly 366 of the plurality of pitch transformation routing assemblies 360 is disposed within an accommodation space 521 of FIG. 5 surrounded by the substrate 326B, the spacer 346 of the first plurality of spacers 340, a substrate 326C, and the spacer 356 of the second plurality of spacers 350.

In examples of the present disclosure, each of the plurality of pitch transformation routing assemblies 360 comprises a plurality of pitch transformation routing members. For example, pitch transformation routing assembly 366 of the plurality of pitch transformation routing assemblies 360 comprises a plurality of pitch transformation routing members 366A.

In examples of the present disclosure, each of the plurality of contact assemblies 370 comprises a plurality of contact members. For example, contact assembly 378 of the plurality of contact assemblies 370 comprises a plurality of contact members 22.

In examples of the present disclosure, each of the plurality of contact members of the plurality of the contact assemblies 370 extends away from a first end of a corresponding pitch transformation routing member. For example, contact member 372F extends away from a first end of a pitch transformation routing member 362F. A front surface of each of the plurality of contact members of a selected contact assembly is disposed in a plane parallel to the X-direction and Z-direction. For example, a front surface of the contact member 372F is disposed in a plane parallel to the X-direction and Z-direction. In examples of the present disclosure, a second end of each of the plurality of pitch transformation routing members of each of the plurality of pitch transformation routing assemblies 360 is attached to a respective hemisphere metal unit of the plurality of hemisphere metal units 390.

In examples of the present disclosure, the connector 2 further comprises a first plurality of standoff assemblies 520 and a second plurality of standoff assemblies 560 (see FIG. 5). Each of the first plurality of standoff assemblies comprises a first plurality of standoff members. For example, a standoff assembly 522 of the first plurality of standoff assemblies 520 comprises standoff members 522A, 522B, . . . and 522J. Each of the second plurality of standoff assemblies comprises a second plurality of standoff members. A front surface of each of the plurality of pitch transformation routing members of a selected pitch transformation routing assembly of the plurality of pitch transformation routing assemblies 360 contacts a corresponding standoff member of the first plurality of standoff members of a selected first plurality of standoff assembly of the first plurality of standoff assemblies 520. For example, a front surface of a pitch transformation routing member 362A of a pitch transformation routing assembly 362 of the plurality of pitch transformation routing assemblies 360 contacts the standoff member 522A of the standoff assembly 522 of the first plurality of standoff assemblies 520. A back surface of each of the plurality of pitch transformation routing members of the selected pitch transformation routing assembly of the plurality of pitch transformation routing assemblies 360 contacts a corresponding standoff member of the second plurality of standoff members of a selected second plurality of standoff assembly of the second plurality of standoff assemblies 560.

In examples of the present disclosure, the plurality of pitch transformation routing assemblies 360, the plurality of contact assemblies 370, the first plurality of spacers 340, and the second plurality of spacers 350 are made of a same conductive material (for example, a copper material or a copper alloy material).

In examples of the present disclosure, the connector 2 further comprises a datum via 397. The datum via 397 passes through a central hole 399 of the front substrate 322, a central hole of each of the plurality of intermediate substrates 326, and a central hole of the back substrate 332.

Figure 4:
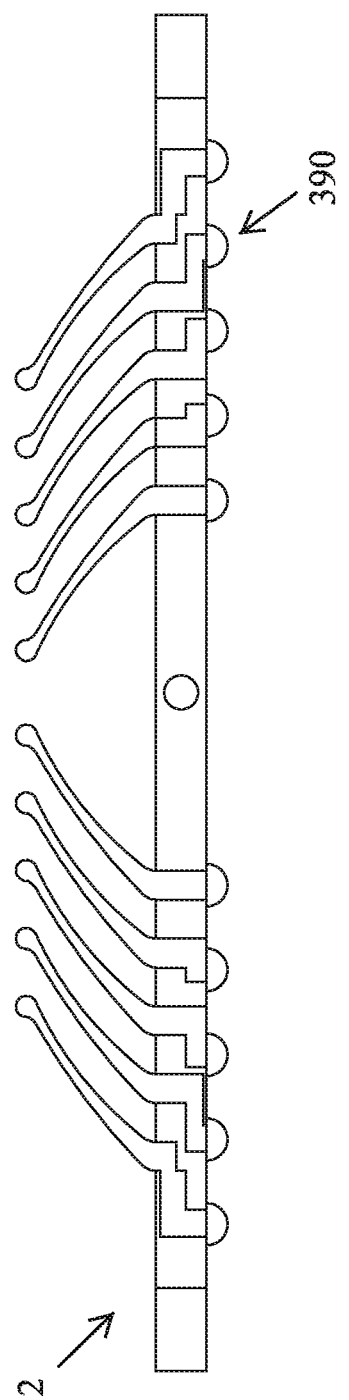
FIG. 4 is a front view of a connector in examples of the present disclosure.
Figure 6:
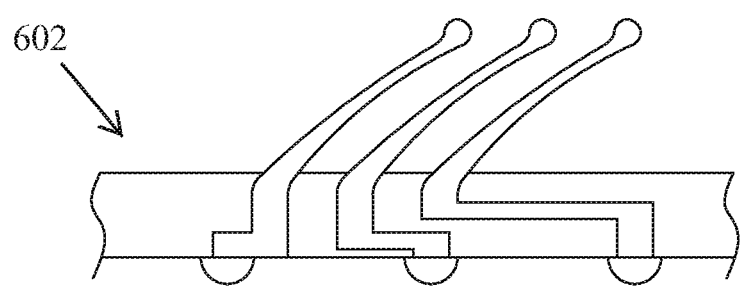
FIG. 6 is a front view of a zoomed-in plot of a connector in examples of the present disclosure.

FIG. 4 is a front view of a connector 2 (without showing the front substrate 322 of FIG. 3) in examples of the present disclosure. FIG. 6 is a front view of a zoomed-in plot of a connector 602 (without showing the front substrate 322 of FIG. 3) in examples of the present disclosure.

Figure 7:
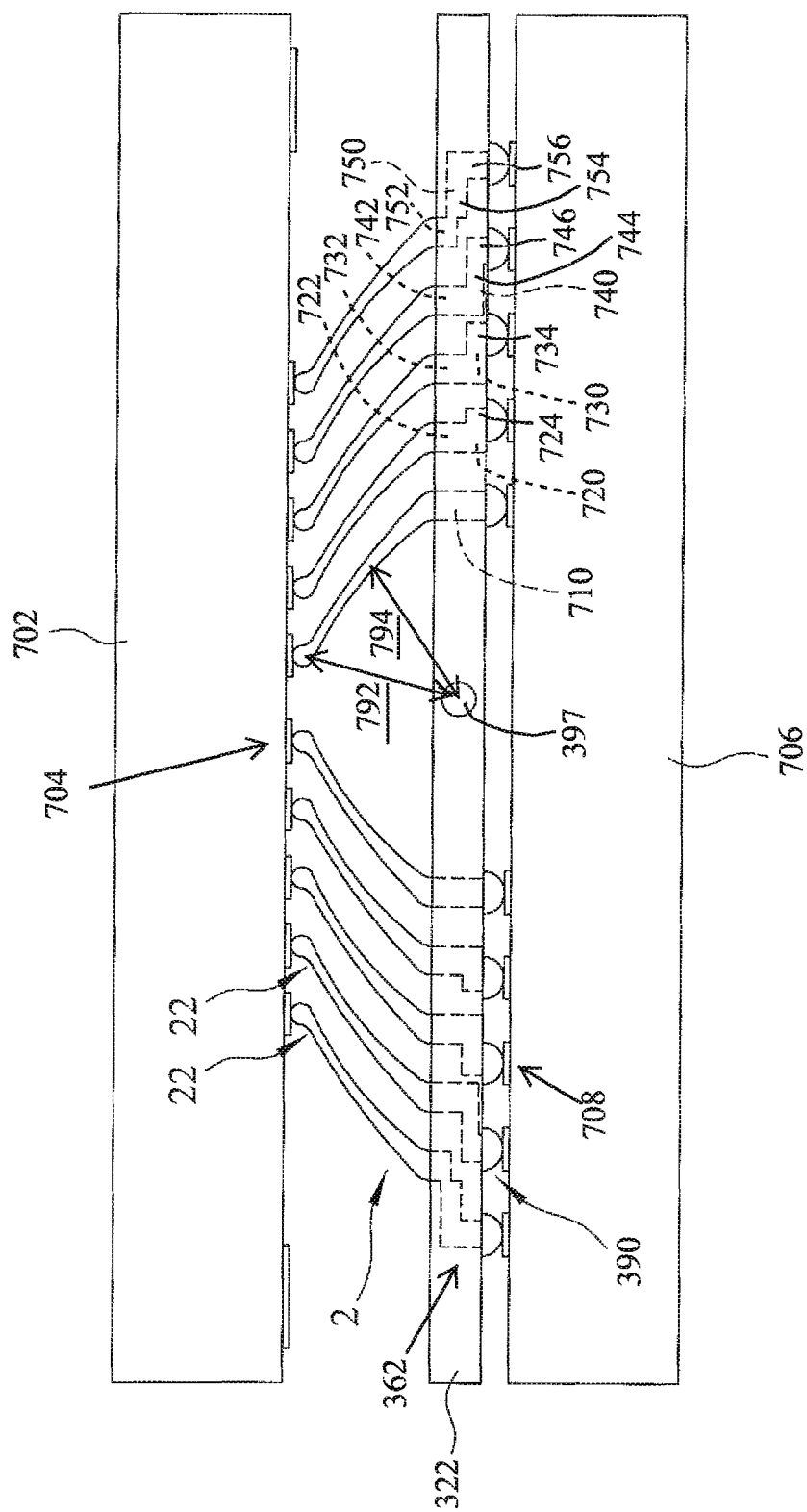
FIG. 7 is a front view of a connector connecting pads of a top board to pads of a bottom board in examples of the present disclosure.

FIG. 7 is a front view of a connector 2 connecting pads 704 of a top board 702 to pads 708 of a bottom board 706 in examples of the present disclosure. The pitch transformation routing assembly 362 of FIG. 3 comprises a first pitch transformation routing member 710, a second pitch transformation routing member 720, a third pitch transformation routing member 730, a fourth pitch transformation routing member 740, and a fifth pitch transformation routing member 750.

In examples of the present disclosure, an entirety of the first pitch transformation routing member 710 extends along Z-direction. The second pitch transformation routing member 720 comprises a top routing section 722 extends along Z-direction; and a horizontal routing section 724 extends along X-direction. The third pitch transformation routing member 730 comprises a top routing section 732 extends along Z-direction; and a horizontal routing section 734 extends along X-direction. The horizontal routing section 724 of the second pitch transformation routing member 720 is shorter than the horizontal routing section 734 of the third pitch transformation routing member 730.

In examples of the present disclosure, the fourth pitch transformation routing member 740 comprises a top routing section 742 extends along Z-direction; a horizontal routing section 744 extends along X-direction; and a bottom routing section 746 extends along Z-direction. The fifth pitch transformation routing member 750 comprises a top routing section 752 extends along Z-direction; a horizontal routing section 754 extends along X-direction; and a bottom routing section 756 extends along Z-direction. The horizontal routing section 744 of the fourth pitch transformation routing member 740 is shorter than the horizontal routing section 754 of the fifth pitch transformation routing member 750.

In examples of the present disclosure, a distance 792 between a centroid of the end portion and a centroid of the datum via 397 is smaller than a distance 794 between a centroid of the slender portion and the centroid of the datum via 397. A distance between a centroid of the reverse end portion and the centroid of the datum via is smaller than a distance between a centroid of the reverse slender portion and the centroid of the datum via.

Figure 8:
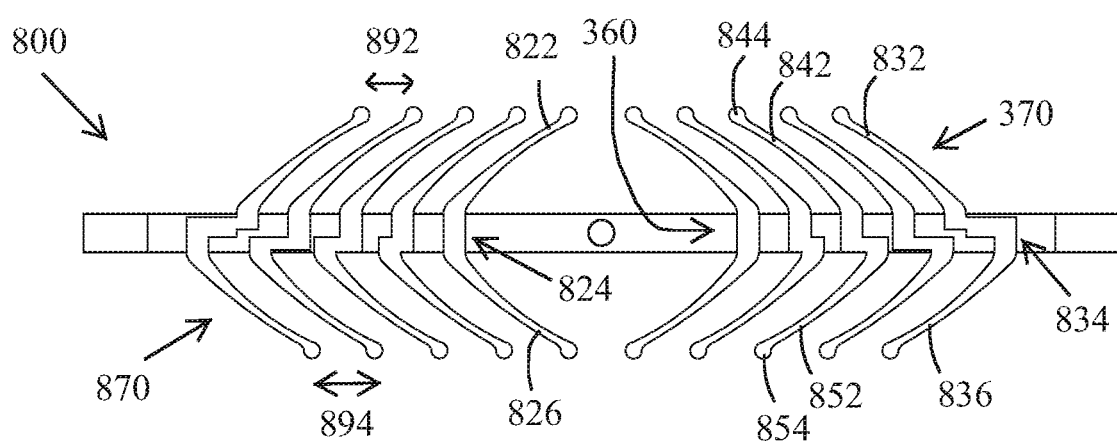
FIG. 8 is a front view of another connector in examples of the present disclosure.

FIG. 8 is a front view of a connector 800 (without showing the front substrate 322 of FIG. 3) in examples of the present disclosure. The connector 800 is similar to the connector 2 of FIG. 4 except that the plurality of hemisphere metal units 390 of FIG. 4 are replaced by a plurality of reverse contact assemblies 870. A second end of each of the plurality of pitch transformation routing members of each of the pitch transformation routing assemblies 360 is attached to a respective reverse contact member of a respective reverse contact assembly of the plurality of reverse contact assemblies 870. A pitch 892 of the plurality of contact members of the plurality of the contact assemblies 370 is smaller than a pitch 894 of the plurality of reverse contact members of the plurality of the reverse contact assemblies 870.

In examples of the present disclosure, a contact member 822, a pitch transformation routing member 824, and a reverse contact member 826 form a letter V shape. A contact member 832, a pitch transformation routing member 834, and a reverse contact member 836 form a shifted letter V shape.

In examples of the present disclosure, each of the plurality of contact members comprises a slender portion 842; and an end portion 844. Each of the plurality of reverse contact members comprises a reverse slender portion 852; and a reverse end portion 854. A length of the slender portion 842 is larger than a length of the end portion 844. A width of the slender portion 842 is smaller than a width of the end portion 844. A length of the reverse slender portion 852 is larger than a length of the reverse end portion 854. A width of the reverse slender portion 852 is smaller than a width of the reverse end portion 854. A majority portion of the end portion 844 is of a first arc shape. A majority portion of the reverse end portion 854 is of a second arc shape.

Figure 9:
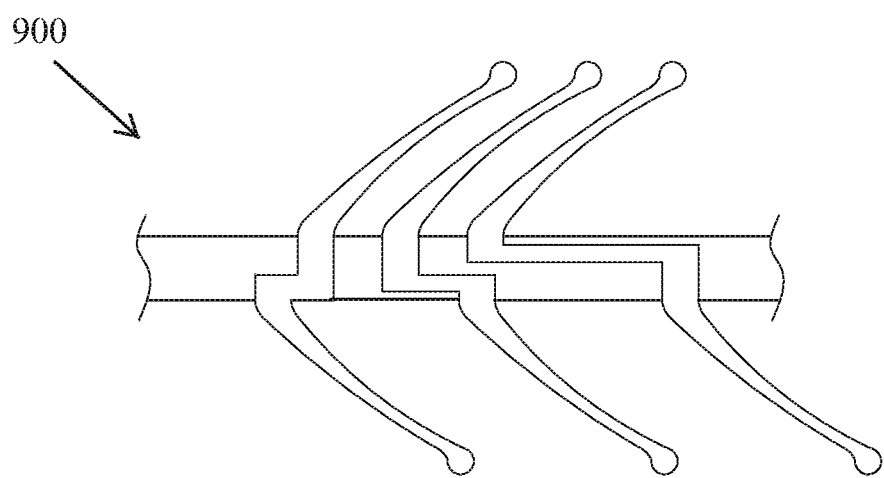
FIG. 9 is a front view of a zoomed-in plot of another connector in examples of the present disclosure.

FIG. 9 is a front view of a zoomed-in plot of a connector 900 (without showing the front substrate 322 of FIG. 3) in examples of the present disclosure.

Figure 10:
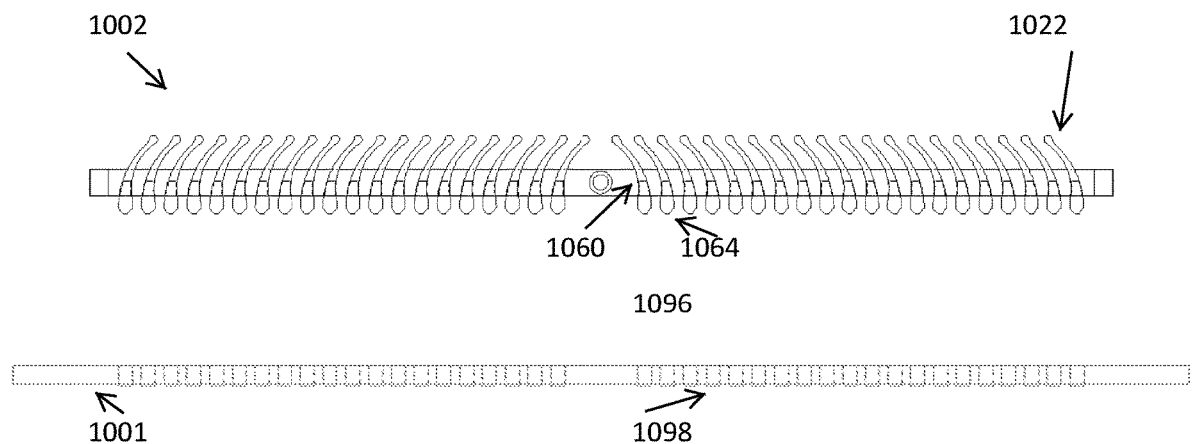
FIG. 10 is a front view of still another connector and a bottom board in examples of the present disclosure.

FIG. 10 is a front view of connector 1002 and a bottom board 1001 in examples of the present disclosure. Connector 1002 is similar to connector 2 of FIG. 3 except that a plurality of contact members 1022 are longer than the plurality of contact members 22 of FIG. 3 and the plurality of pitch transformation routing assemblies 360 are replaced by a plurality of routing assemblies 1060. A first end of each of the routing member of the plurality of routing assemblies 1060 is directly connected to a respective contact member of the plurality of contact members 1022. A second end of each of the routing member of the plurality of routing assemblies 1060 is of a cone shape. The bottom board 1001 comprises a plurality of sockets 1096, terminated on the bottom side with copper pad 1098, configured to receive the plurality of cone shapes 1064 of the second ends of the plurality of routing assemblies 1060. In examples of the present disclosure, each routing member of the plurality of routing assemblies 1060 and a respective (directly connected) contact member of the plurality of contact members 1022 are a single-piece construction. For one example of the single-piece construction, formed in a single wafer etching process. For another example of the single-piece construction, formed in a single metal casting process.

In examples of the present disclosure, a (top) portion of a front surface of each of the plurality of routing members of a selected routing assembly of the plurality of routing assemblies 1060 contacts a corresponding standoff member of the first plurality of standoff members of a selected first plurality of standoff assembly of the first plurality of standoff assemblies 520 of FIG. 3. A (bottom) portion of a front surface of each of the plurality of contact members 1022 contacts a corresponding standoff member of the first plurality of standoff members of a selected first plurality of standoff assembly of the first plurality of standoff assemblies 520 of FIG. 3.

Figure 11:
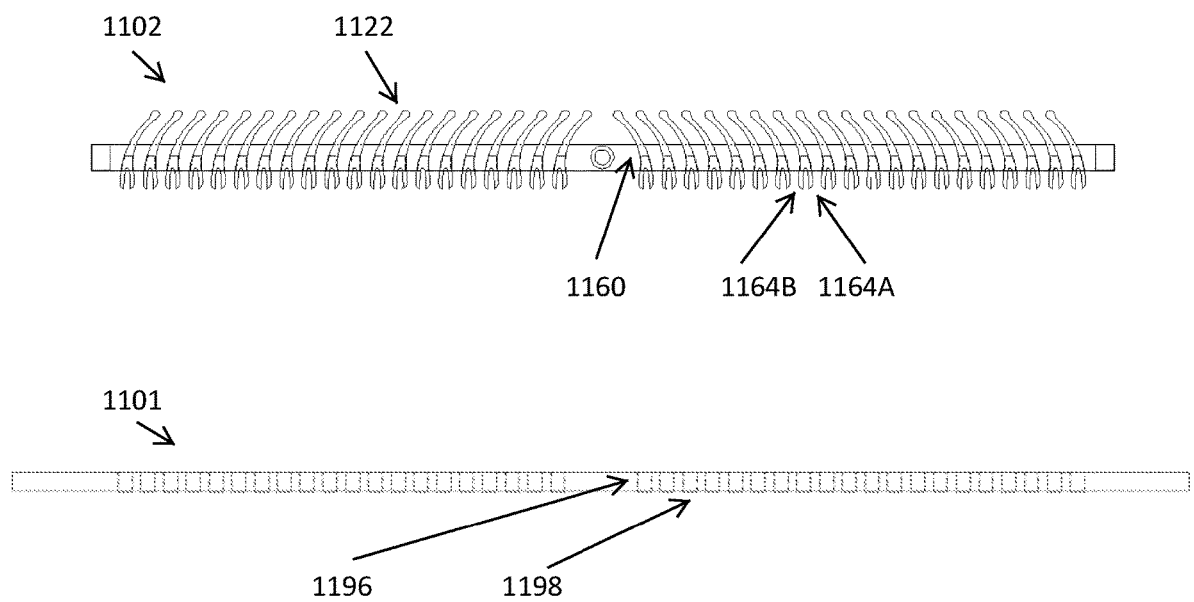
FIG. 11 is a front view of yet another connector and a bottom board in examples of the present disclosure.

FIG. 11 is a front view of connector 1102 and a bottom board 1101 in examples of the present disclosure. Connector 1102 is similar to connector 2 of FIG. 3 except that a plurality of contact members 1122 are longer than the plurality of contact members 22 of FIG. 3 and the plurality of pitch transformation routing assemblies 360 are replaced by a plurality of routing assemblies 1160. A first end of each of the routing member of the plurality of routing assemblies 1160 is directly connected to a respective contact member of the plurality of contact members 1122. A second end of each of the routing member of the plurality of routing assemblies 1160 comprises a first prong 1164A and a second prong 1164B opposite the first prong 1164A. The bottom board 1101 comprises a plurality of sockets 1196 each being configured to receive a respective first prong 1164A and a respective second prong 1164B. The bottom board 1101 contains a plurality of surface pads 1198.

Figure 12:
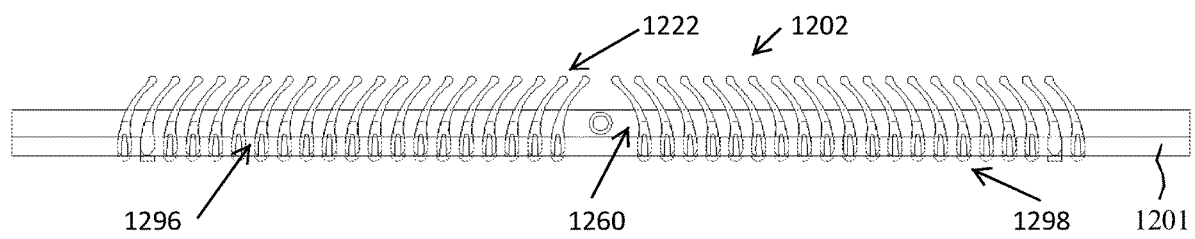
FIG. 12 is an assembled front view of the connector of FIG. 10 attached to the bottom board in examples of the present disclosure.

FIG. 12 is a front view of connector 1202 attached to a bottom board 1201 in examples of the present disclosure. Connector 1202 is similar to connector 2 of FIG. 3 except that a plurality of contact members 1222 are longer than the plurality of contact members 22 of FIG. 3 and the plurality of pitch transformation routing assemblies 360 are replaced by a plurality of routing assemblies 1260. A first end of each of the routing member of the plurality of routing assemblies 1260 is directly connected to a respective contact member of the plurality of contact members 1222. A second end of each of the routing member of the plurality of routing assemblies 1260 is of a shape of a cone or a prong configuration facilitating plugging operations into a plurality of sockets 1296. The bottom board 1201 comprises the plurality of sockets 1296 configured to receive the plurality of cone or prong shapes of the second ends of the plurality of routing assemblies 1260 that are terminated with a plurality of solder disk or solder bumps 1298.

Figure 13:
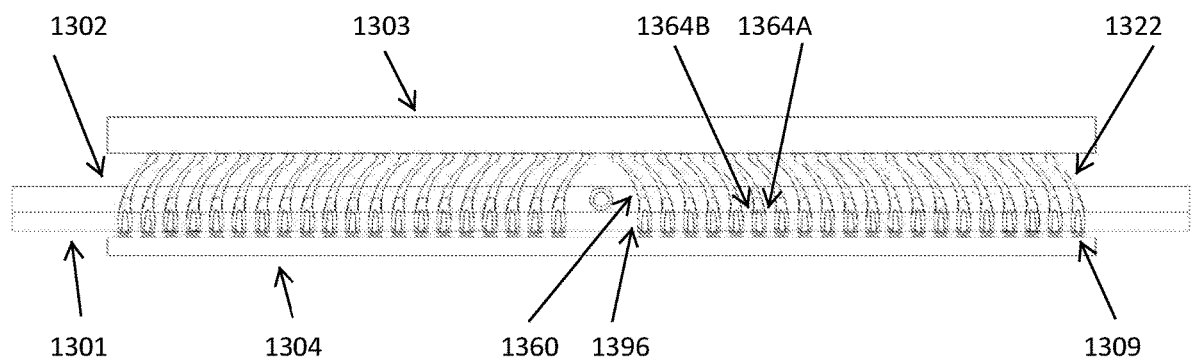
FIG. 13 is an assembled front view of a connector mated between a top board and a bottom board in examples of the present disclosure.

FIG. 13 is a front view of a connector 1302 mated between a top board 1303 and a bottom board 1301 in examples of the present disclosure. Top portions of a plurality of contact members 1322 are configured to slide along bottom surfaces of contact pads on a bottom surface of a top board 1303. The bottom board 1301 is further connected to a base board 1304 through a plurality of solder balls 1309. Connector 1302 is similar to connector 2 of FIG. 3 except that a plurality of contact members 1322 are longer than the plurality of contact members 22 of FIG. 3 and the plurality of pitch transformation routing assemblies 360 are replaced by a plurality of routing assemblies 1360. A first end of each of the routing member of the plurality of routing assemblies 1360 is directly connected to a respective contact member of the plurality of contact members 1322. A second end of each of the routing member of the plurality of routing assemblies 1360 comprises a first prong 1364A and a second prong 1364B opposite the first prong 1364A. The bottom board 1301 comprises a plurality of sockets 1396 each being configured to receive a respective first prong 1364A and a respective second prong 1364B.

Figure 14:
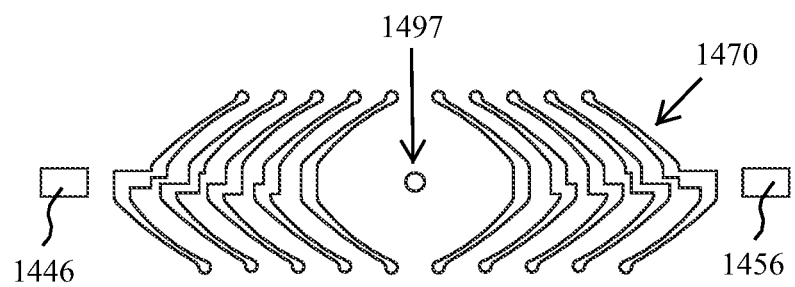
FIG. 14 is a front view of a plurality of contact assemblies, a datum via, and two spacers in examples of the present disclosure.

FIG. 14 shows a plurality of contact assemblies 1470, a datum via 1497, and spacers 1446 and 1456 in examples of the present disclosure. Contact structure integrated with pitch translation routing. Upper pitch is less than that of the lower pitch. Left spacer 1446 and right spacer 1456 and the datum via 1497 are fabricated from the same material as the contact and translation routing structures. The spacers 1446 and 1456 act as fillers that seal the ends of contact block structure.

Figure 15:
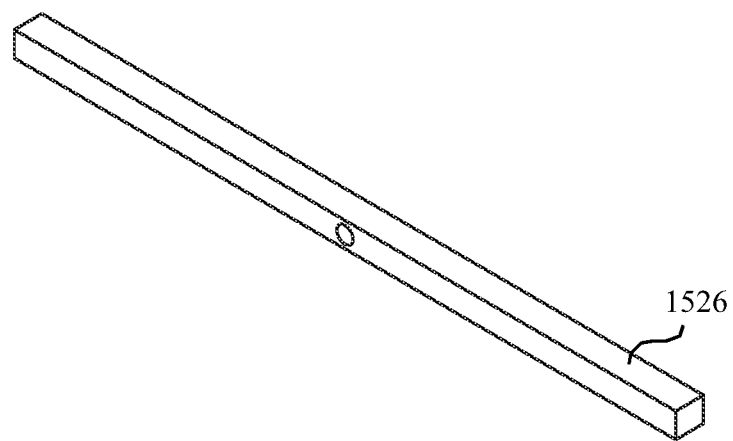
FIG. 15 is a perspective view of a substrate in examples of the present disclosure.

FIG. 15 shows a substrate 1526 in examples of the present disclosure. The plurality of contact assemblies 1470 of FIG. 14 will be bonded to the substrate 1526.

Figure 16:
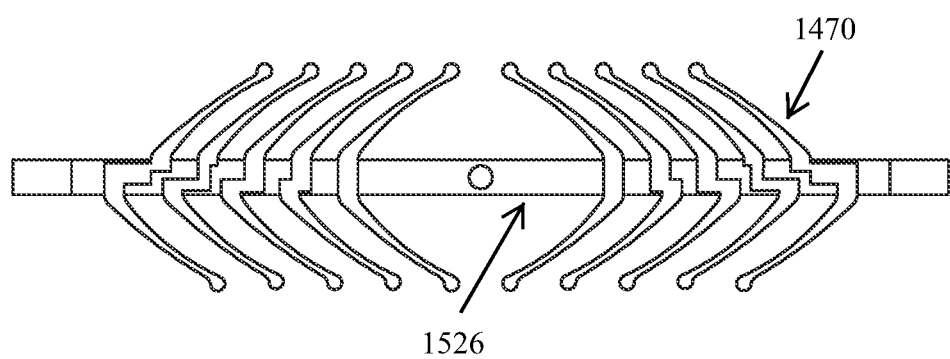
FIG. 16 is a front view of the plurality of contact assemblies of FIG. 14 bonded to the substrate of FIG. 15 in examples of the present disclosure.

FIG. 16 shows the plurality of contact assemblies 1470 of FIG. 14 bonded to the substrate 1526 of FIG. 15 in examples of the present disclosure.

Figure 17:
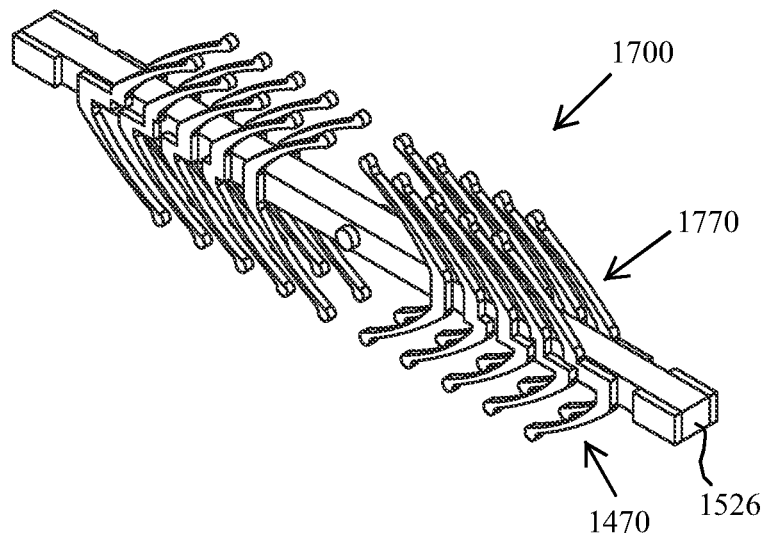
FIG. 17 is a perspective view of a subassembly in examples of the present disclosure.

FIG. 17 shows a subassembly 1700 comprising the plurality of contact assemblies 1470 of FIG. 14 and a plurality of contact assemblies 1770 bonded to opposite sides of the substrate 1526 of FIG. 15 in examples of the present disclosure.

Figure 18:
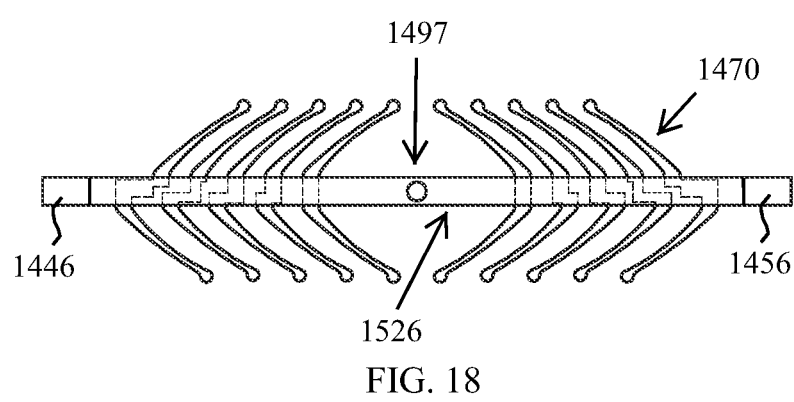
FIG. 18 is a front view of the subassembly of FIG. 17 in examples of the present disclosure.

FIG. 18 is a front view of the plurality of contact assemblies 1470, a datum via 1497, spacers 1446 and 1456, and the substrate 1526 in examples of the present disclosure.

Figure 19:
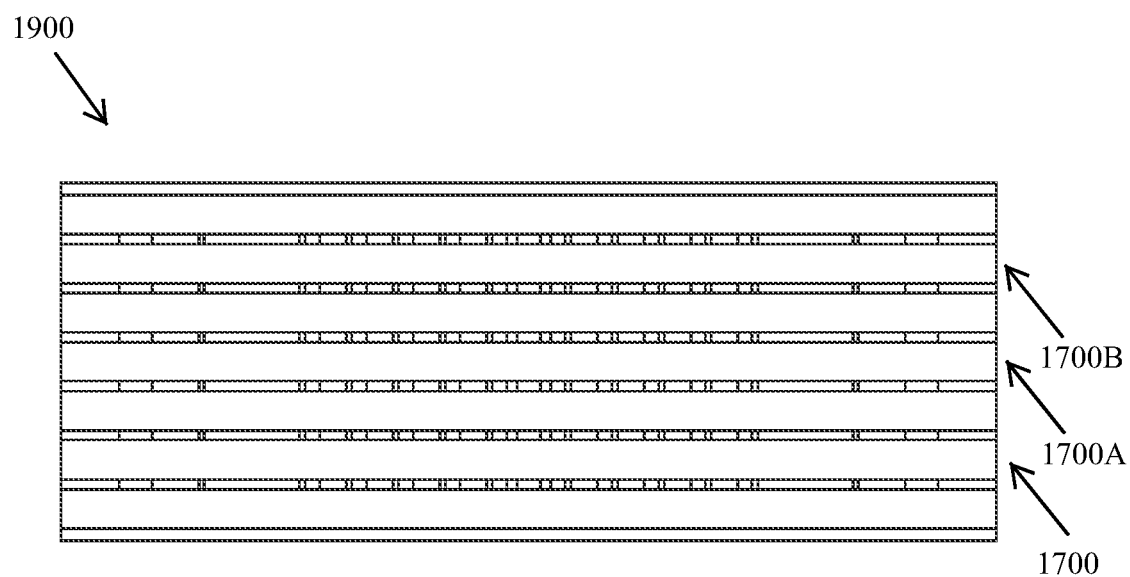
FIG. 19 is a top view of a connector in examples of the present disclosure.

FIG. 19 is a top view of a connector 1900 in examples of the present disclosure. The connector 1900 comprises the subassembly 1700 of FIG. 17 and other subassemblies 1700A and 1700B (having similar structure as subassembly 1700). The connector 1900 excludes a plurality of standoff assemblies 520 of FIG. 5 contacting the plurality of pitch transformation routing members 362 of FIG. 3.

Figure 20:
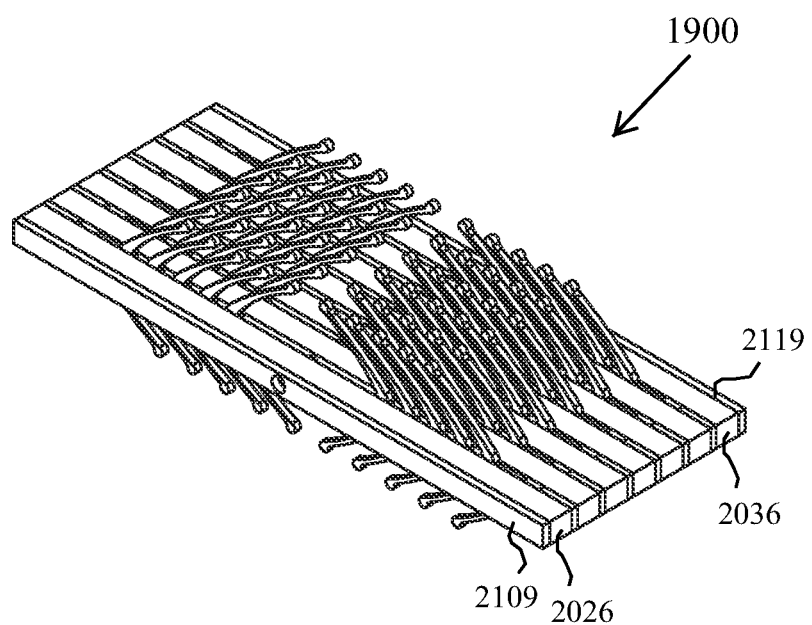
FIG. 20 is a perspective view of the connector of FIG. 19 in examples of the present disclosure.
Figure 21:
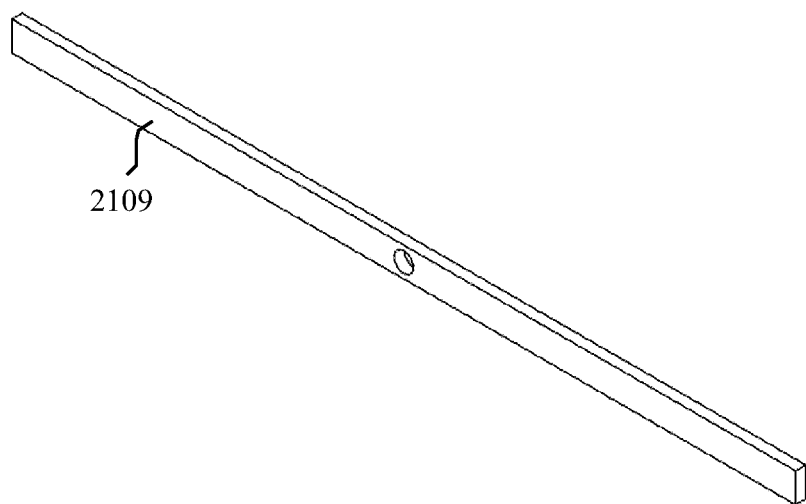
FIG. 21 is a perspective view of a copper clad layer in examples of the present disclosure.

FIG. 20 is a perspective view of the connector 1900 of FIG. 19 in examples of the present disclosure. A copper clad layer 2109 of FIG. 21 is directly attached to the substrate 2026. A copper clad layer 2119 is directly attached to the substrate 2036.

FIG. 21 shows the copper clad layer 2109.

Those of ordinary skill in the art may recognize that modifications of the embodiments disclosed herein are possible. For example, a total number of the plurality of intermediate substrates 336 may vary. Other modifications may occur to those of ordinary skill in this art, and all such modifications are deemed to fall within the purview of the present invention, as defined by the claims.

The invention claimed is:

1. An electrical connector comprising:
   a substrate extending along a first direction;
   a pitch transformation routing assembly formed on the substrate and comprising a plurality of pitch transformation routing members;
   a first plurality of contact members, wherein each contact member extends away in a second direction from a first end of a corresponding pitch transformation routing member, the second direction being perpendicular to the first direction; and
a second plurality of contact members, wherein each contact member extends away in the second direction from a second end of a corresponding pitch transformation routing member, the second end opposite the first end of the corresponding pitch transformation routing member,
wherein a first subset of the pitch transformation routing members each comprises a first routing section extending in the first direction and a second routing section extending in the second direction, a pitch of the first plurality of contact members associated with the first subset of the pitch transformation routing members is different from a pitch of the second plurality of contact members associated with the first subset of the pitch transformation routing members.

2. The electrical connector of claim 1, wherein the first plurality of contact members each comprises a slender portion and an end portion.

3. The electrical connector of claim 2, wherein the second plurality of contact members each comprises a hemisphere metal unit.

4. The electrical connector of claim 2, wherein the second plurality of contact members comprises a reverse slender portion and a reverse end portion.

5. The electrical connector of claim 1, wherein the pitch transformation routing members in the first subset comprise the first routing sections having increasing length in the first direction from a first pitch transformation routing member in the first subset to a last pitch transformation routing member in the first subset.

6. The electrical connector of claim 5, wherein the pitch transformation routing members in the first subset comprise the second routing sections having different length in the second direction.

7. The electrical connector of claim 6, wherein each of the pitch transformation routing members in the first subset comprises one or more first routing sections and one or more second routing sections.

8. The electrical connector of claim 6, the first plurality of contact members extending from the first ends of the first subset of the pitch transformation routing members have a pitch smaller than a pitch of the second plurality of contact members extending from the second ends of the first subset of the pitch transformation routing members.

9. The electrical connector of claim 1, wherein the substrate comprises a non-conductive layer and the pitch transformation routing members and the first plurality and the second plurality of contact members each comprises a conductive material.

10. The electrical connector of claim 9, wherein the pitch transformation routing members and the first plurality and the second plurality of contact members each comprises a copper material or a copper alloy material.

11. The electrical connector of claim 1, wherein the substrate comprises a central hole located centrally on the substrate, and wherein the first plurality of contact members comprises:
a first group of contact members extending from pitch transformation routing members formed on a first end of the substrate, each contact member including a slender portion and an end portion inclinedly extending towards the central hole; and
a second group of contact members extending from pitch transformation routing members formed on a second end of the substrate on an opposite side of the central hole, each contact member including a slender portion and an end portion inclinedly extending towards the central hole.

12. An electrical connector comprising:
a plurality of substrates extending along a first direction, the substrates being spaced apart from each other in a second direction by a plurality of spacers;
a plurality of pitch transformation routing assemblies, each pitch transformation routing assembly being formed on a respective substrate and comprising a plurality of pitch transformation routing members;
a first plurality of contact members, wherein each contact member extends away in a third direction from a first end of a corresponding pitch transformation routing member, the third direction being perpendicular to the first direction and the second direction; and
a second plurality of contact members, wherein each contact member extends away in the third direction from a second end of a corresponding pitch transformation routing member, the second end opposite the first end of the corresponding pitch transformation routing member,
wherein each pitch transformation routing assembly comprises a first subset of the pitch transformation routing members, each pitch transformation routing member in the first subset comprises a first routing section extending in the first direction and a second routing section extending in the third direction, a pitch of the first plurality of contact members associated with the first subset of the pitch transformation routing members is different from a pitch of the second plurality of contact members associated with the first subset of the pitch transformation routing members.

13. The electrical connector of claim 12, wherein the first plurality of contact members each comprises a slender portion and an end portion and the second plurality of contact members each comprises a hemisphere metal unit.

14. The electrical connector of claim 12, wherein the first plurality of contact members each comprises a slender portion and an end portion and the second plurality of contact members comprises a reverse slender portion and a reverse end portion.

15. The electrical connector of claim 12, wherein the pitch transformation routing members in the first subset comprise the first routing sections having increasing length in the first direction from a first pitch transformation routing member in the first subset to a last pitch transformation routing member in the first subset.

16. The electrical connector of claim 15, wherein the pitch transformation routing members in the first subset comprise the second routing sections having different length in the second direction.

17. The electrical connector of claim 16, wherein each of the pitch transformation routing members in the first subset comprises one or more first routing sections and one or more second routing sections.

18. The electrical connector of claim 16, the first plurality of contact members extending from the first ends of the first subset of the pitch transformation routing members have a pitch smaller than a pitch of the second plurality of contact members extending from the second ends of the first subset of the pitch transformation routing members.

19. The electrical connector of claim 12, wherein each of the plurality of substrates comprises a central hole located centrally on the substrate, and wherein the first plurality of contact members comprises:

a first group of contact members extending from pitch transformation routing members formed on a first end of the substrates, each contact member including a slender portion and an end portion inclinedly extending towards the central hole of the respective substrate; and a second group of contact members extending from pitch transformation routing members formed on a second end of the substrates on opposite sides of the central holes, each contact member including a slender portion and an end portion inclinedly extending towards the central hole of the respective substrate.

20. An electrical connector comprising:

a substrate extending along a first direction;

a routing assembly formed on the substrate and comprising a plurality of routing members, each routing member having a first end and a second end, the second end opposite the first end in a second direction, the second direction being perpendicular to the first direction; and a plurality of contact members, wherein each contact member connects to a respective routing member at the first end of the routing member and comprises a slender portion and an end portion extending away from the first end of the routing member, wherein the second ends of the plurality of routing members have a shape adapted to be coupled to respective sockets of a board to be coupled thereto.

21. The electrical connector of claim 20, wherein the second end of each of the routing members is of a cylinder shape.

22. The electrical connector of claim 20, wherein the second end of each of the routing members is of a cone shape.

23. The electrical connector of claim 20, wherein the second end of each of the routing members comprises:

a first prong; and a second prong opposite the first prong.

24. The electrical connector of claim 20, wherein each contact member and a respective routing member are formed in a single-piece construction.

* * * * *